(12) United States Patent
Leitgeb et al.

(10) Patent No.: US 11,277,907 B2
(45) Date of Patent: Mar. 15, 2022

(54) COMPONENT CARRIER WITH EXPOSED LAYER

(71) Applicant: AT&S Austria Technologie & Systemtechnik Aktiengesellschaft, Leoben (AT)

(72) Inventors: Markus Leitgeb, Trofaiach (AT); Bernhard Reitmaier, Pölstal/Möderbrugg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/949,211

(22) Filed: Oct. 20, 2020

(65) Prior Publication Data

US 2021/0144849 A1 May 13, 2021

(30) Foreign Application Priority Data

Nov. 8, 2019 (EP) .................................... 19208063

(51) Int. Cl.
*H05K 1/02* (2006.01)
*H05K 1/03* (2006.01)
(Continued)

(52) U.S. Cl.
CPC ......... *H05K 1/0298* (2013.01); *H05K 1/0326* (2013.01); *H05K 1/0346* (2013.01);
(Continued)

(58) Field of Classification Search
CPC .. H05K 1/0298; H05K 1/0326; H05K 1/0346; H05K 1/115; H05K 3/4623;
(Continued)

(56) References Cited

U.S. PATENT DOCUMENTS 5,841,075 A * 11/1998 Hanson ............... H01L 23/5386
174/250
6,486,394 B1 * 11/2002 Schmidt ............... H05K 1/0221
156/52
(Continued)

FOREIGN PATENT DOCUMENTS

| CN | 106341944 A | 1/2017 |
| CN | 106879195 A | 6/2017 |

(Continued)

OTHER PUBLICATIONS

Definition of "Epoxy Resin", dictinary.com (Year: 2021).*
(Continued)

*Primary Examiner* — Steven T Sawyer
(74) *Attorney, Agent, or Firm* — Robert A. Blaha; Smith Tempel Blaha LLC

(57) ABSTRACT

A component carrier includes a stack having at least one electrically conductive layer structure and/or at least one electrically insulating layer structure, and a partially exposed layer in a central region of the stack being exposed with regard to an upper side and a lower side by a respective blind hole formed in the stack, wherein each of opposing main surfaces of the exposed layer is partially covered by a respective adhesive layer.

17 Claims, 4 Drawing Sheets

(51) Int. Cl.
*H05K 1/11* (2006.01)
*H05K 3/46* (2006.01)

(52) U.S. Cl.
CPC ............ *H05K 1/115* (2013.01); *H05K 3/4623* (2013.01); *H05K 2201/0154* (2013.01); *H05K 2201/10151* (2013.01)

(58) Field of Classification Search
CPC . H05K 2201/0154; H05K 2201/10151; H05K 2201/10083; H05K 1/185; H05K 3/4697; H05K 1/182–183; H04R 2201/003; H04R 31/00; H04R 19/04; H04R 19/02
See application file for complete search history.

(56) References Cited

U.S. PATENT DOCUMENTS

| | | | | |
|---|---|---|---|---|
| 7,385,472 | B1* | 6/2008 | Downes | H05K 3/429 |
| | | | | 174/262 |
| 7,514,801 | B2* | 4/2009 | Schriks | H01L 23/49822 |
| | | | | 257/787 |
| 2001/0010303 | A1* | 8/2001 | Caron | H05K 3/4691 |
| | | | | 216/18 |
| 2008/0037815 | A1 | 3/2008 | Ito et al. | |
| 2008/0093118 | A1* | 4/2008 | Takahashi | H05K 3/4691 |
| | | | | 174/264 |
| 2009/0127638 | A1 | 5/2009 | Kilger et al. | |
| 2009/0154730 | A1 | 6/2009 | Demuynck | |
| 2010/0025087 | A1* | 2/2010 | Takahashi | H05K 3/4691 |
| | | | | 174/254 |
| 2010/0230148 | A1 | 9/2010 | Kariya et al. | |
| 2011/0199739 | A1* | 8/2011 | Naganuma | H05K 3/4691 |
| | | | | 361/749 |
| 2016/0095207 | A1* | 3/2016 | Taniguchi | H05K 3/4691 |
| | | | | 174/252 |

FOREIGN PATENT DOCUMENTS

| | | |
|---|---|---|
| DE | 202017106975 U1 | 11/2017 |
| EP | 3 196 952 A1 | 7/2017 |
| JP | 2004140422 A | 5/2004 |
| KR | 100674304 B1 | 1/2007 |
| KR | 20150092840 A | 8/2015 |
| WO | 2011150738 A1 | 12/2011 |
| WO | 2019020795 A1 | 1/2019 |

OTHER PUBLICATIONS

DeGroote, B.; Partial European Search Report in EP Application No. 19 20 8063.8; dated Nov. 16, 2020; pp. 1-22; European Patent Office, 80298, Munich, Germany.
Biesterfeld—Competence in Solutions; downloaded from https://www.biesterfeld.com/en/de/company/business-divisions/biesterfeld-plastic/; Dec. 29, 2020; pp. 1-5; Biesterfeld AG—Biesterfeld Plastic GmbH, Karlsruhe, Germany.
DeGroote, B.; Partial European Serach Report in EP Application No. 19 20 8063.8; dated Aug. 20, 2020; pp. 1-16; European Patent Office, 80298, Munich, Germany.

* cited by examiner

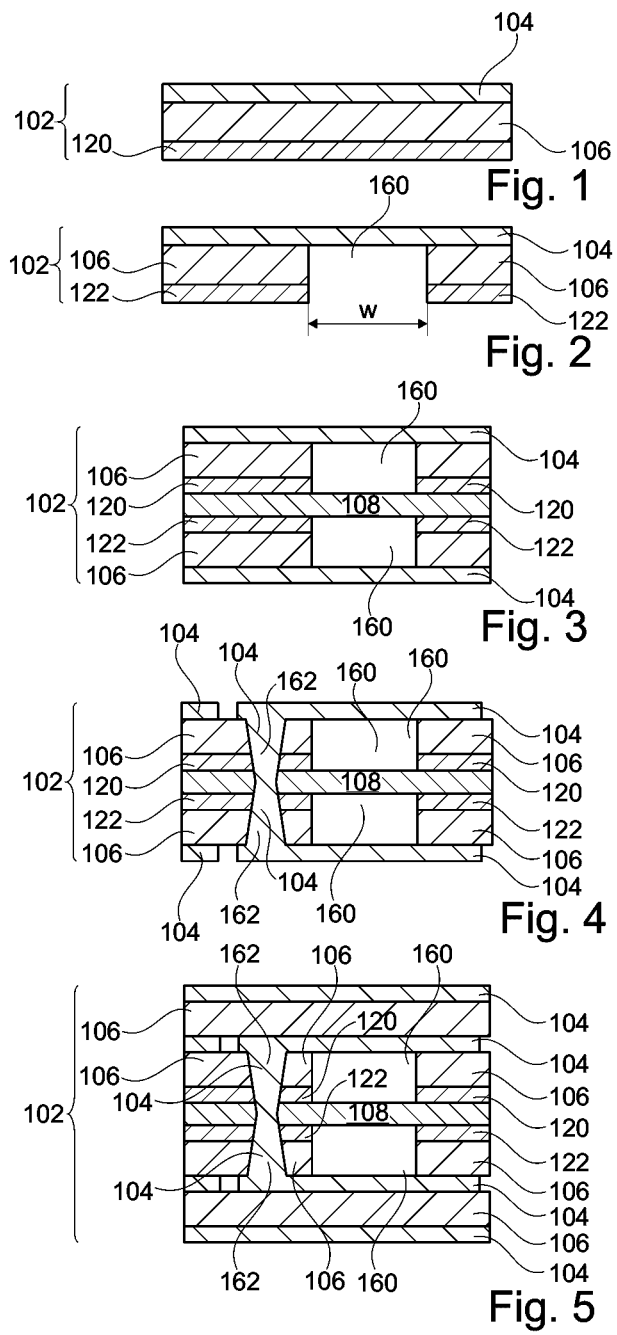

COMPONENT CARRIER WITH EXPOSED LAYER

CROSS-REFERENCE TO RELATED APPLICATIONS

This application claims the benefit of the filing date of the European Patent Application No. 19 208 063.8, filed Nov. 8, 2019, the disclosure of which is hereby incorporated herein by reference.

TECHNICAL FIELD

The invention relates to a method of manufacturing a component carrier and to a component carrier.

BACKGROUND

In the context of growing product functionalities of component carriers equipped with one or more electronic components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

SUMMARY

There may be a need to provide an efficiently manufacturable component carrier with extended functionality.

According to an exemplary embodiment of the invention, a component carrier is provided which comprises a (in particular laminated) stack comprising at least one electrically conductive layer structure and/or at least one electrically insulating layer structure, and a partially exposed layer in a central region of the stack being exposed with regard to an upper side and a lower side by a respective blind hole formed in the stack, wherein each of opposing main surfaces of the exposed layer is partially covered by a respective adhesive layer.

According to another exemplary embodiment of the invention, a method of manufacturing a component carrier is provided, wherein the method comprises forming a stack comprising at least one electrically conductive layer structure and/or at least one electrically insulating layer structure, forming a first blind hole in the stack extending from a first main surface of the stack up to an exposed layer in a central region of the stack, forming a second blind hole in the stack extending from a second main surface of the stack opposing the first main surface up to the exposed layer, and connecting the exposed layer within the stack (in particular directly) between two adhesive layers each arranged on part of a respective one of opposing main surfaces of the exposed layer.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may denote a flat body of substantially parallel aligned layer structures of component carrier material (for instance copper, resin and glass), wherein the layer structures are integrally connected with one another, for instance by lamination.

In the context of the present application, the term "layer structure" may particularly denote a continuous layer, a patterned layer or a plurality of non-consecutive islands within a common plane.

In the context of the present application, the term "blind hole" may particularly denote a hole in the stack which is delimited from at a bottom or top side by the exposed layer and laterally by sidewalls of the stack.

In the context of the present application, the term "exposed layer" may particularly denote a thin film being partially uncovered and partially covered by material of the component carrier. In particular, the exposed layer may be uncovered in surface areas of both opposing main surfaces at a horizontally central portion of the exposed layer. However, at the same time, the partially exposed layer may be covered on both opposing main surfaces partially by a respective adhesive layer, for instance connecting the exposed layer with a lateral, in particular circumferential, region of the stack.

In the context of the present application, the term "adhesive layer" may particularly denote a sheet or film made of a material which is capable of adhering the exposed layer on both of its opposing main surfaces with material of the stack. Such an adhesion may be accomplished by curing a liquid adhesive, by curing a solid adhesive layer (for instance by lamination of prepreg), or in any other way.

In the context of the present application, the term "central region of the stack" may particularly denote a region of the stack in an interior of its layer structures and being spaced with respect to both opposing main surfaces of the stack. For instance, the central region may be located in the middle of the stack in a vertical direction. It is however also possible that the central region is arranged asymmetrically with respect to the two opposing main surfaces of the stack, i.e. closer to one of the main surfaces than to the other of the main surfaces.

According to an exemplary embodiment of the invention, a component carrier is provided in which an exposed layer is exposed with regard to an environment from both opposing main surfaces thereof and preferably in a central region of a stack. The stack may support and protect the exposed layer, preferably circumferentially, via adhesive layers reliably connecting the exposed layer on top and on bottom. By taking this measure, it is possible to provide a component carrier with an exposed layer which is in direct communication or interaction with the environment so as to be capable as serving for instance as sensor and/or actuator. By arranging the exposed layer in a central region of the stack, i.e. vertically spaced with respect to both opposing main surfaces of the stack, the mechanically sensitive exposed layer can also be reliably protected against mechanical damage by exterior impact. Highly advantageously, the exposed layer (which may be exposed partially or with its full surface) may be sandwiched between two patterned adhesive layers ensuring at the same time exposure of the exposed layer in the region of the blind holes of the stack and proper mechanical connection of the sensitive exposed layer with the stack.

In the following, further exemplary embodiments of the method and the component carrier will be explained.

In an embodiment, the component carrier is configured as sensor (in particular one of a microphone, a pressure sensor, a moisture sensor, an acceleration sensor, and a gas sensor), an actuator (in particular a loud-speaker) or a microelectromechanical system (MEMS). In the context of such applications, the exposed layer may be the functionally active constituent.

In an embodiment, the exposed layer forms a functional diaphragm (which may be denoted alternatively as a functional layer of diaphragm or partition structure, in particular ultra-sensitive partition structure). When embodied as a functional diaphragm, the exposed layer may be configured and enabled to freely oscillate or move in its exposed portion within the volumes delimited by the opposing blind holes. Such a freely oscillating functional diaphragm may be advantageous for functions such as sensor applications (for instance when the component carrier functions as a microphone) and for actuating functions (for instance when the component carrier functions as a loudspeaker).

For instance, the functional layer or diaphragm can be an electrically insulating and/or conductive layer or diaphragm. It can be a polymer-based (for instance organic) structure, a copper-based structure, a graphene coated (in particular superconductive) layer, etc. Other materials of the functional layer or diaphragm are possible. For instance, it may be made of a one-way osmotic material. It is also possible that the functional layer or diaphragm is made of a high power supportive thermoplastic material or of an elastomer material. In yet another embodiment, the functional layer or diaphragm may be made of a non-elastic material. In an embodiment, the exposed layer comprises or consists of an elastic material, in particular polyimide. When made of an elastic material such as polyimide, oscillating properties of the functional diaphragm may be enabled. To enhance a specific function of the elastic exposed layer, it is also possible to form one or more additional layers on the surface of the exposed layer, for instance made of a piezoelectric material. With a piezoelectric material, it is possible to electrically detect mechanical oscillations of the elastic exposed layer or to force the elastic exposed layer to move in accordance with an applied electric signal.

In an embodiment, the exposed layer is a single material layer. In such an embodiment, the exposed layer is made of a homogeneous material. This ensures homogeneous properties of the exposed layer as a whole.

In another embodiment, the exposed layer comprises multiple sub-structures of different materials. In said embodiment, the exposed layer may have a heterogeneous material composition (for instance made of different layers, each having another material) which makes it possible to fine-tune or adjust the desired properties of the exposed layer. For instance, the exposed layer may be composed of multiple sublayers which may be stacked or sandwiched so as to form, together, the exposed layer. One example is the above-mentioned coverage of an elastic sublayer (for instance made of polyimide) with a piezoelectric sublayer for fine tuning for instance the sensor or actuator function of the component carrier.

In an embodiment, a thickness of the exposed layer is in a range be-tween 1 µm and 30 µm, in particular in a range between 3 µm and 7 µm. When the thickness of the exposed layer is selected in the mentioned ranges, it may be ensured on the one hand that the exposed layer may freely move (for instance triggered by an external influence such as an external pressure or triggered by an internal electric stimulus signal, which may for instance be applied via a piezoelectric material of the exposed layer). On the other hand, the exposed layer should also not become excessively thin in order to prevent that the component carrier with its highly sensitive exposed layer becomes prone to mechanical damage by an impact from the environment during use.

In an embodiment, a lateral offset between a center of an outermost portion of the first blind hole and a center of an outermost portion of the second blind hole is less than 20 µm, in particular not more than 15 µm. In the context of the present application, the term "lateral offset" may particularly denote a spatial shift along a horizontal plane between said mentioned opposing outermost portions of the blind holes, i.e. portions of the blind holes directly adjacent to the main surfaces of the stack. In accordance with a highly advantageous manufacturing process which will be described below in further detail, a result may be that the lateral or horizontal offset between the two opposing outermost portions of the blind holes delimiting the exposed portion of the exposed layer can be made very small. When the blind holes are for instance formed by laser cutting, such a lateral offset may be the consequence of the fact that re-adjusting a laser source with respect to a preform of the component carrier involves a certain inaccuracy, resulting in the lateral offset.

In an embodiment, a lateral offset between centers of innermost portions of the first and second blind holes (i.e. portions of the blind holes directly adjacent to the exposed layer) is larger than a lateral offset between centers of outermost portions of said first and second blind holes (i.e. portions of the blind holes directly adjacent to the main surfaces of the stack). Again, referring to the highly advantageous manufacturing method described below in further detail, the lateral offset of one or both of the blind holes may be larger at the inner side of the respective blind hole exposing the exposed layer as compared to the outermost portions. However, a small lateral offset at the outermost portions simplifies a mechanical match between the component carrier and further components which may be mounted on the component carrier at its exterior surface.

In an embodiment, an innermost portion of the first blind hole tapers from the exposed layer towards a first main surface of the stack into which the first blind hole extends. Correspondingly, an innermost portion of the second blind hole may taper from the exposed layer towards a second main surface of the stack into which the second blind hole extends. Such a tapering in a cone-shaped or truncate-shaped manner may be the fingerprint of the formation of an innermost portion of the respective blind hole by laser processing. As a consequence of the energy impact of a laser beam on material of the stack in the innermost portions of the blind holes during laser processing, such a tapering may be created. Due to the advantageous manufacturing method described below in further detail, the tapering in the innermost portions occurs from an inside to an outside of the respective blind hole, i.e. narrowing towards the exterior main surface of the respective blind hole and the stack.

In an embodiment, an outermost portion of the first blind hole tapers from a first main surface of the stack into which the first blind hole extends towards the exposed layer. Correspondingly, an outermost portion of the second blind hole may taper from a second main surface of the stack into which the second blind hole extends towards the exposed layer. This geometry may be the fingerprint of the fact that said blind holes may be formed by two stages of laser processing.

Said outermost portions may taper in opposite direction as compared to said innermost portions of the first and second blind holes. Descriptively speaking, this may result in substantially X-shaped blind holes.

In an embodiment, at least one electrically conductive layer structure within the stack and delimited by the first or second blind hole has an indentation at an inner sidewall of the stack. Also, such an indentation of an electrically conductive layer structure (in particular a copper foil) may be the fingerprint of an advantageous manufacturing method, as described below.

In an embodiment, the component carrier comprises a component embedded in the exposed layer or surface-mounted on the exposed layer. Such a component may form an exposed portion of the exposed layer. Highly advantageously, a component (for instance a semiconductor chip, a MEMS or any other kind of sensor or actuator component) may be embedded in the exposed layer so as to be specifically sensitive to any phenomenon or parameter to be detected in the environment. For example, a pressure sensor may be formed in component carrier technology (in particular PCB technology) with the pressure sensing component being arranged in the exposed portion of the exposed layer. In one embodiment, the component may form the entire exposed portion of the exposed layer, i.e. without any further constituent. In another embodiment, the component may be embedded in the exposed layer, for instance so as to extend up to an exposed surface of the exposed layer. In such an embodiment, the embedded component is directly exposed to an environment which may be advantageous for sensing and/or actuating applications. In yet another embodiment, the embedded component may be embedded in an interior of the exposed layer so as to be fully circumferentially covered with material of the exposed layer. It is also possible that the component is arranged in one of the blind holes next or adjacent to the exposed layer, or that the component is arranged directly behind the exposed layer (for instance for protection purposes).

In an embodiment, at least part of a surface of the component is ex-posed to an environment. This may be in particular advantageous when the component is a sensor component, for instance for sensing a parameter from the environment (such as in case of a microphone, a gas sensor, or a chemical sensor).

In an embodiment, the stack forms an annular body. Thus, the space consumption of such a component carrier is very small. The exposed part of the exposed layer may be arranged in a central through hole of the annular body, and thus in a protected but nevertheless externally accessible way.

In an embodiment, the component carrier comprises an element to be protected (in particular a sensor element), wherein the exposed layer is arranged for protecting the element to be protected. In such embodiments, a function of the exposed layer may be to protect a sensitive element with respect to an undesired impact, such as mechanical load or a chemical environment. Thus, the exposed layer can be also used as a protection for something (for instance for a sensor).

In an embodiment, the exposed layer comprises or consists of at least one material of the group consisting of an electrically conductive material and an electrically insulating material, in particular a high-performance plastic material. For example, the high-performance plastic material comprises at least one of the group consisting of polyethylene terephthalate, polyoxymethylene, polyamide, polyimide, polytrimethylene terephthalate, polyetheretherketone, polyetherketonetherketoneketone, polyetherketone, ethylene tetrafluoroethylene, perfluoroalkoxy alkanes, fluorinated ethylene propylene, styrol polymerisate, polycarbonate, polyphenylene sulfide, polyethersulfone, polyphenylsulfone, and polysulfone.

In an embodiment, each of the opposing main surfaces of the exposed layer is covered by the respective adhesive layer in portions in which the exposed layer is located within material of the stack, i.e. is not exposed. Furthermore, each of the opposing main surfaces of the exposed layer may be free of the respective adhesive layer in portions relating to the blind holes. Thus, the exposed layer may be reliably mounted within the stack with high mechanical robustness, while a central portion in the blind hole region is exposed. This may advantageously ensure that the exposed layer can fulfill its function.

In an embodiment, the method comprises arranging the layer to be exposed (i.e. the above-mentioned exposed layer in an earlier stage of the manufacturing process in which this layer is not yet exposed) between two parts of the stack (or two partial stacks), each part comprising a respective cavity, and each cavity exposing a portion of a respective main surface of the layer. In other words, each partial stack or part of the stack may be formed as two or more stacked layer structures with a respective cavity having a closed bottom. Said partial stack or part of the stack may then be connected with the layer to be exposed so that the open side of the cavity is oriented towards the layer to be exposed. This may simplify the manufacturing method, since two easily processable separate partial stacks may firstly be formed and connected with the layer in between, before further processing the obtained structure. Connecting the layer to be exposed to the open side of the respective cavity may ensure a mechanical protection of the layer to be exposed during a subsequent manufacturing process by the closed side of the cavity.

Thus, the method may comprise sandwiching the layer to be exposed between two partial stacks with cavities exposing a portion of the layer. Thereafter, the method may comprise connecting (in particular laminating) one or more further layer structures to the opposing main surfaces of the partial stacks, providing said at least one further layer structure on each of the opposing main surfaces with a recess from the other side (in particular by laser processing), and thereby obtaining an intermediate structure in which the exposed portion of the layer is arranged, protected from both sides with a remaining protecting layer. By such a highly advantageous manufacturing method, it is possible to reliably protect the exposed layer in an interior of a preform of the component carrier during further build-up of the stack by lamination or the like. For example, while the stack is inserted into a press for connecting further layer structures of the stack at an upper and a lower main surface, the exposed layer is safely protected from damage thanks to the upper and lower protection layer. A respective protecting layer on each of both opposing sides of the stack prevents any impact from the environment on the sensitive layer to be exposed.

In an embodiment, the method comprises using the intermediate structure for at least one of patterning and plating. In particular, the method may comprise patterning and plating exterior portions of the further layer structures before removing the exposed portions of the protecting layers. In the protected configuration of the preform of the component carrier, any etching, laser processing, and material deposition procedures may be carried out without undesired impact on the sensitive exposed layer being still protected by the protection layers.

In an embodiment, the method comprises subsequently removing the protecting layers in the blind holes so that the blind holes are formed by connecting a respective cavity with a respective recess, as a result of the removal of the protection layers. This finally exposes the exposed layer at a very late stage of the manufacturing process, so that the sensitive exposed layer remains protected over a long part of the manufacturing process.

In an embodiment, the method comprises forming the recesses and/or the cavities, and in particular the entire blind holes, by laser processing. By forming the recesses and/or the cavities in the stack by laser processing, a highly precise laser cutting procedure can be carried out which translates to a precisely defined exposed layer. Thus, a high precision and a high accuracy may be obtained. Hence, for recess and for cavity formation, laser processing is a preferred option, since it ensures a high precision and a fast manufacturing process.

In an embodiment, the component carrier comprises at least one component surface mounted on and/or embedded in the component carrier. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier (for example a printed circuit board, a substrate, or an interposer) in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

A substrate or interposer may comprise or consist of at least a layer of glass, silicon, ceramic and/or organic material (like resin). A substrate or interposer may also comprise a photo-imageable or dry-etchable organic material like epoxy-based build-up films or polymer compounds like polyimide, polybenzoxazole, or benzocyclobutene.

In an embodiment, the at least one electrically insulating layer structure comprises at least one of the group consisting of resin (such as rein-forced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon is a registered mark of The Chemours Company FC LLC of Wilmington, Del., U.S.A. Reinforcing structures such as webs, fibers or spheres, for example made of glass (multilayer glass) may be used as well. Although prepreg, FR4, or epoxy-based build-up film or photo-imageable dielectrics are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type component carrier. In such an embodiment, the component carrier is a compound of multiple layer structures which are stacked and connected together by applying a pressing force, if desired accompanied by heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 1, FIG. 2, FIG. 3, FIG. 4, FIG. 5, FIG. 6 and FIG. 7 illustrate cross-sectional views of structures obtained during manufacturing a component carrier, shown in FIG. 8, according to an exemplary embodiment of the invention.

DETAILED DESCRIPTION OF EXEMPLARY EMBODIMENTS

Figure 6:
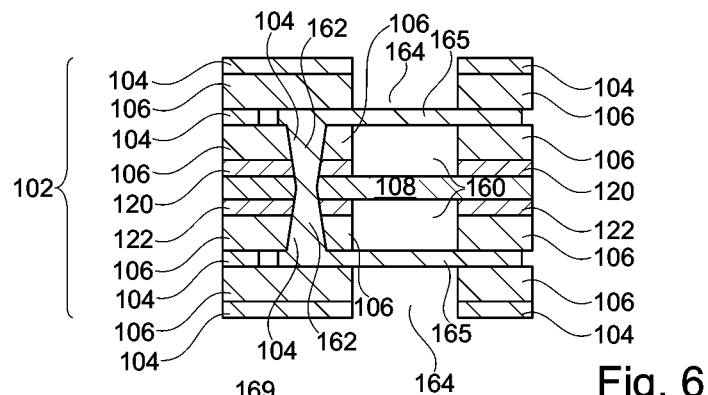

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a PCB-inner layer may be precisely exposed by forming blind holes from both sides with a very small front-to-back shift of the blind holes and its sub-portions on both opposing main surfaces of the exposed layer. In particular, such a high accuracy may be obtained by using laser processing for the formation of at least part of the blind holes. Furthermore, the exposed layer to be partially exposed may be covered on both opposing main surfaces with a very thin adhesive layer which preferably does not overlap into the exposed region. Thus, the thickness of the exposed layer in the exposed portions may be further reduced. For instance, a thickness of the adhesive layer may be in a range between 1 µm and 30 µm, in particular in a range between 3 µm and 7 µm, for instance 5 µm. It is possible that the exposed region is exposed first and cleaned afterwards.

As a result of the manufacturing process described referring to the figures below in detail, the exterior portions of the blind holes may slightly taper towards an interior of the blind holes. In contrast to this, the innermost portions of the blind hole may taper towards an exterior of the blind holes and thus towards the opposing main surfaces of the stack, in particular in a stronger way than the outermost portions. Advantageously, a top to bottom offset may be small in particular between the outermost portions of the blind holes, since such an offset is only caused by tolerances created by optical imaging and/or sensing. Furthermore, the lateral offset may be larger in the innermost portions of the blind holes as compared to the outermost portions.

According to an exemplary embodiment of the invention, an ultra-precise exposure of an inner layer of the stack may be achieved. An inner exposed layer of a component carrier (such as a printed circuit board) should be as thin and precise as possible. The inner exposed layer can be protected from external influences (such as occurring in terms of PCB manufacturing processes) until the end. In addition, an ultra-thin structure of the inner layer can be realized with a partial or full-surface embedded layer. Use of a copper foil (on a carrier) instead of a core may make formation of an ultra-thin stack interior exposed layer possible.

Opening the exposed layer may be achieved by applying adhesive layers on top and bottom of the exposed layer before carrying out an ablation process (for instance laser or dry etching, compare for example FIG. 2), and subsequently executing the laser process.

Advantages of exemplary embodiments of the invention are the option of a very thin multilayer construction when using copper foils. Furthermore, pre-laminating procedures may be avoided, and thus an improved registration in further setup situations may be possible. It may further be possible to protect the layer to be exposed until the end of the manufacture process. As a result, the exposed layer remains protected against influences of the manufacturing process over a large portion of the manufacturing process.

Cores used for the manufacturing process may be provided with openings or cavities by laser drilling. Such processed cores may be applied to an inner layer. By attaching this kind of cores on each side of the inner layer, cavities may be formed protected by a copper layer of the core during the different processes of a multi-layer build-up.

Concerning tolerances, the largest possible range may be the diameter ±150 μm. The smallest possible range may be the diameter ±15 μm.

As a result of the laser process, a flow reducing effect of a created carbonization layer may be advantageous. The thickness of such a carbonization layer may be not more than 5 μm, in particular smaller than 1 μm.

Figure 7:
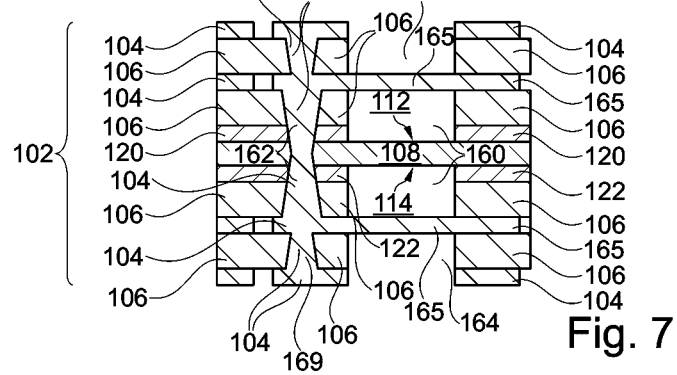
Figure 8:
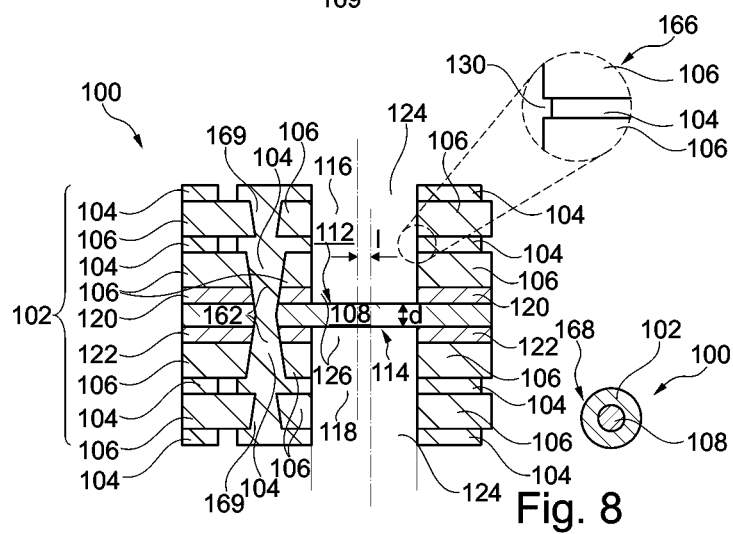

FIG. 1 to FIG. 8 illustrate cross-sectional views of structures obtained during manufacturing a component carrier 100, shown in FIG. 8, according to an exemplary embodiment of the invention.

FIG. 1 illustrates a cross-sectional view of a partial stack 102 comprising a central electrically insulating layer structure 106 covered on one main surface with an electrically conductive layer structure 104 and on the opposing other main surface with an adhesive layer 120. For example, the electrically conductive layer structure 104 may comprise continuous or patterned copper foils and/or vertical through connections, for example copper filled laser vias. In the shown embodiment, the electrically conductive layer structure 104 is a continuous copper foil. The electrically insulating layer structure 106 may comprise a resin (such as epoxy resin), optionally comprising reinforcing particles therein (for instance glass fibers or glass spheres). For instance, the electrically insulating layer structure 106 may be made of FR4. In the shown embodiment, the electrically insulating layer structure 106 may be fully cured. The layer structures 104, 106 may be connected by lamination, i.e. the application of pressure and/or heat.

The adhesive material of adhesive layer 120 may be solid (for instance at least partially uncured resin, such as prepreg) or may be liquid. Thin adhesive layer 120 may for instance have a thickness of 5 μm. For instance, the adhesive layer 120 may be applied to the electrically insulating layer structure 106 by dispensing or printing. Alternatively, it is possible to laminate an adhesive layer 120 to the electrically insulating layer structure 106 in such a way that the lamination does not cause full curing of the adhesive layer 120.

FIG. 1 illustrates a layer stack 102 which is used twice as a constituent for forming component carrier 100. In other words, two of the constituents shown in FIG. 1 may be manufactured as a basis for forming a component carrier 100 according to an exemplary embodiment of the invention.

In order to obtain the layer structure shown in FIG. 2, the constituent shown in FIG. 1 may be made subject to a material removal procedure to form a cavity 160 extending through the electrically insulating layer structure 106 and through the adhesive layer 120, but not through the electrically conductive layer structure 104. Formation of cavity 160 may be accomplished for instance by laser processing, by mechanically cutting, by etching, or any other form of ablation. When laser processing or another ablation process is used for forming cavity 160, exterior width w of the cavity 160 may be defined with a particular high precision. Although not shown in FIG. 2, a laser formed cavity 160 may taper towards electrically conductive layer structure 104.

In order to obtain the structure shown in FIG. 3, two of the processed constituents shown in FIG. 2 may be connected to one another with a continuous layer 108 (this layer can be also discretely placed with small overlap into an adjacent rigid portion) in between, which later will form the exposed layer 108. The two constituents according to FIG. 2 and the layer 108 are connected so that the layer 108 is directly sandwiched between the two opposing adhesive layers 120 and so that the electrically conductive layer structures 104 close the cavities 160 towards an exterior of the illustrated preform of component carrier 100. In other words, the open side of the respective cavity 160 may face the layer 108, whereas the closed side of the respective cavity 160 forms part of an exterior surface of the structure shown in FIG. 3. This protects the sensitive layer 108 from mechanical damage and provides a robust exterior surface enabling a further build-up in accordance with a desired application.

As a result of the processing according to FIG. 3, the layer 108 to be later exposed is positioned in an interior of the layer stack 102 sandwiched between two adhesive layers 120, 122. Hence, the layer 108 to be exposed is interposed between two partial stacks of stack 102. The cavities 160 expose a laterally central portion of the layer 108 to be exposed.

Referring to FIG. 4 and FIG. 5, further layer structures 104, 106 are partially formed in the structure shown in FIG. 3 and are partially laminated to the opposing main surfaces of the structure shown in FIG. 3.

As shown in FIG. 4, the structure shown in FIG. 3 may be made subject to any desired patterning and/or plating procedure. In particular, vertical through-connections 162 may be formed in the stack 102 by laser drilling from the two opposing main surfaces of the structure shown in FIG. 3 and by subsequently filling so created laser vias with electrically conductive material, such as copper, for instance by plating. As further shown in FIG. 4, both the upper main surface and the lower main surface of the illustrated process stack 102 may be made subject to a patterning procedure. Patterning may be accomplished by lithography and etching, by laser processing, etc.

As shown in FIG. 5, the structure shown in FIG. 4 may then be made subject to a further build-up process. More specifically, one or more further electrically insulating layer structures 106 and/or one or more further electrically conductive layer structures 104 may be connected to the upper main surface and/or to the lower main surface of the structure shown in FIG. 4. A corresponding build-up may be symmetric (i.e. identical on both opposing main surfaces) or asymmetric (i.e. different on the two opposing main surfaces). For instance, such a connection of further layer structures 104, 106 may be accomplished by lamination, i.e. the application of pressure and/or heat.

Referring to FIG. 6, a respective recess 164 may be formed in the further layer structures 104, 106 on each of the opposing main surfaces of stack 102. For instance, each respective recess 164 may extend from an exterior of the stack 102 up to the respectively second electrically conductive layer structure 104 calculated from each of the opposing main surfaces of stack 102. Said respectively second electrically conductive layer structure 104 is illustrated as protecting layer 165 and may function as a stop layer for the recess formation process. Preferably, the recesses 164 are formed by laser processing. Although not shown in FIG. 6, this may result in a tapering of the recesses 164 towards the central layer 108. As a result of the recess formation, an intermediate structure is obtained in which the exposed portion of the layer 108 is protected from both sides with a remaining protecting layer 165. As shown, a respective one of the protecting layers 165 is spaced with respect to the layer 108 by a respective one of the cavities 160. The protecting layers 165 may hence protect the layer 108 during a subsequent patterning and plating process, see FIG. 7.

In order to obtain the layer structure shown in FIG. 6, the layer structure shown in FIG. 5 may be made subject to a further material removal process. Again, said material removal process may be carried out by laser processing for obtaining a high precision. Alternatively, the material removal process may be a mechanical material removal process or may be accomplished by etching. As a result of said material removal process, material of the two uppermost layer structures 104, 106 on both opposing main surfaces of the stack 102 shown in FIG. 5 can be accomplished. Thus, said recesses 164 may be formed on both opposing main surfaces of the structure shown in FIG. 6. The electrically conductive layer structures 104 below the two uppermost layer structures 104, 106 on both opposing main surfaces of the stack 102 may serve as stop layers of the material removal process and may withstand the material removal process.

In order to obtain the layer structure shown in FIG. 7, the exposed electrically conductive layer structures 104 on both opposing main surfaces of the stack 102 shown in FIG. 6 may be patterned. Such a patterning procedure may again be carried out by a lithography and etching process, by mechanical removing copper material, by laser processing, etc. Further vertical through-connections 169 may be formed in the stack 102 by laser drilling from the two opposing main surfaces of the structure shown in FIG. 6 and by subsequently filling laser vias with electrically conductive material, such as copper, for instance by plating. Thus, the intermediate structure of FIG. 6 may be further processed by patterning and plating to obtain the structure shown in FIG. 7.

During this procedure, the protecting layers 165 may advantageously protect the sensitive layer 108 to be exposed against damage during the patterning and plating process.

Referring to FIG. 8, a first blind hole 116 may be formed in the stack 102 extending from a first (according to FIG. 8 upper) main surface of the stack 102 up to the exposed layer 108 in a laterally central region of the stack 102. Furthermore, a second blind hole 118 is formed in the stack 102 extending from a second (according to FIG. 8 lower) main surface opposing the first main surface up to the exposed layer 108. The blind holes 116, 118 may be formed by removing exposed portions of the protection layers 165 by laser processing. By formation of the blind holes 116, 118, the portions of the protecting layers 165 which are not arranged within the layer structures 104, 106 of the stack 102 are removed above and below the layer 108, which is thereby exposed with regard to the environment. The blind holes 116, 118 may be formed in one common process, in particular by etching the protection layers 165 (which may be made of copper).

As a result, the component carrier 100 is obtained which comprises the stack 102 and the partially exposed layer 108 in a vertically and horizontally central region of the stack 102. Exposed layer 108 is exposed with regard to an upper side 112 and a lower side 114 by a respective one of blind holes 116, 118 formed in the stack 102. Each of opposing main surfaces of the exposed layer 108 is partially covered by a respective adhesive layer 120, 122 where covered within the stack 102, whereas the stack-exposed portion of layer 108 is also exposed with respect to the adhesive layers 120, 122. More specifically, each of the opposing main surfaces of the exposed layer 108 is covered by the respective adhesive layer 120, 122 only in portions in which the exposed layer 108 is located within material of the stack 102, whereas each of the opposing main surfaces of the exposed layer 108 is free of the respective adhesive layer 120, 122 in portions relating to the blind holes 116, 118. The shown component carrier 100 may be configured as a sensor or a microelectromechanical system having, as functional structure, the exposed layer 108 which forms a functional diaphragm. For instance, the exposed layer 108 comprises or consists of an elastic polymer. A thickness d of the exposed layer 108 may be for instance 5 µm, thereby enabling the functional diaphragm to freely move even in the presence of small forces.

As shown, a lateral front to back side offset I between a center of an outermost portion 124 of the first blind hole 116 and a center of an outermost portion 124 of the second blind hole 118 may be 15 µm. In contrast to this (see FIG. 9), a lateral front to back side offset L between respective centers of innermost portions 126 of the first and second blind holes 116, 118 may be larger than the lateral front to back side offset I between the respective centers of the outermost portions 124 of said first and second blind holes 116, 118.

Although not shown in FIG. 8, the innermost portion 126 of the first blind hole 116 may slightly taper from the exposed layer 108 towards a first (according to FIG. 8 upper) main surface of the stack 102 into which the first blind hole 116 extends. Correspondingly, the innermost portion 126 of the second blind hole 118 may taper from the exposed layer 108 towards a second (according to FIG. 8 lower) main surface of the stack 102 into which the second blind hole 118 extends. Moreover, an outermost portion 124 of the first blind hole 116 tapers from the first main surface of the stack 102 into which the first blind hole 116 extends towards the exposed layer 108. In a corresponding way, an outermost portion 124 of the second blind hole 118 tapers from the second main surface of the stack 102 into which the second blind hole 118 extends towards the exposed layer 108. This geometry can be best seen in the embodiment of FIG. 12 described below. Descriptively speaking, the blind holes 116, 118 may be substantially X-shaped. This tapering geometry may be the fingerprint and result of the laser processing for creating the cavities 160 and the recesses 164.

As already mentioned, in order to obtain the component carrier 100 according to FIG. 8, the exposed central portions of the protection layers 165 may be removed. For instance, this may be accomplished by etching. As a result, indentations 130 are formed in exposed sidewalls of the corresponding partially removed electrically conductive layer structures 104, as shown in a detail 166 of FIG. 8.

As can be taken from a detail 168, the component carrier 100 has the shape of a ring in a plan view (for instance with circular or rectangular shape or any other shape). By defining the blind holes 116, 118 by combining or connecting the cavities 160 with the recesses 164 by removing exposed portions of the protection layers 165, precisely defined and fully exposed layer 108 is obtained which is nevertheless safely connected within the stack 102 by the adhesive layers 120, 122. Furthermore, due to the formation of recesses 164 and cavities 160 by laser processing, the lateral offsets I, L both between outermost portions 124 and innermost portions 126 of the blind holes 116, 118 is very small.

Figure 9:
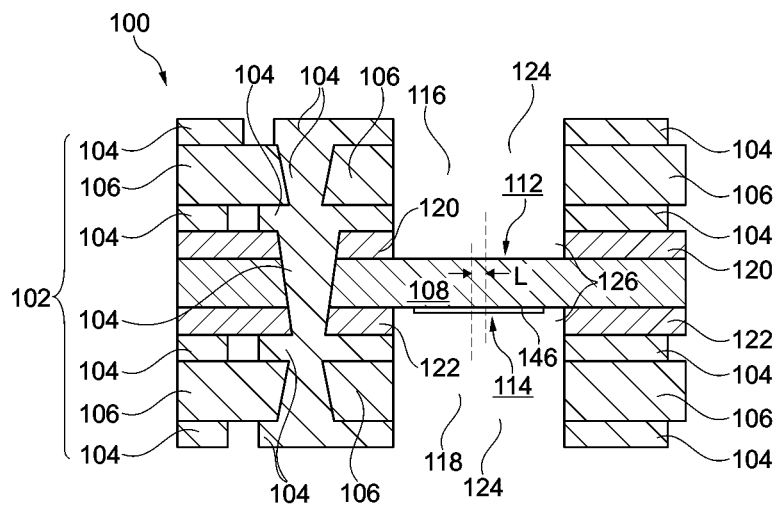
FIG. 9 illustrates a cross-sectional view of a component carrier according to another exemplary embodiment of the invention.

FIG. 9 illustrates a cross-sectional view of a component carrier 100 according to another exemplary embodiment of the invention.

As shown by comparison of FIG. 8 with FIG. 9, lateral offset L in the innermost portions 126 of the blind holes 116, 118 is larger than the lateral offsets I at the outermost portions 124 of the blind holes 116, 118. This is a consequence of the manufacturing method described above.

Furthermore, and in contrast to FIG. 8, the component carrier 100 according to FIG. 9 has an exposed layer 108 composed of two sub-structures, i.e. an elastic main body (for instance made of polyimide) and a piezoelectric layer 146 formed thereon for applying and/or detecting an electric signal related to an elastic motion of the exposed layer 108.

Figure 10:
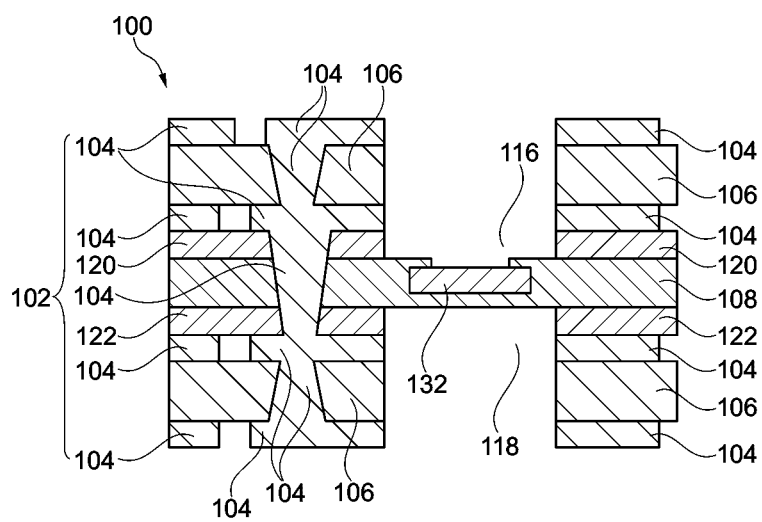
FIG. 10 illustrates a cross-sectional view of a component carrier according to still another exemplary embodiment of the invention.

FIG. 10 illustrates a cross-sectional view of a component carrier 100 according to still another exemplary embodiment of the invention. This embodiment comprises a component 132 embedded in the exposed layer 108, but being exposed towards an environment.

FIG. 10 illustrates a component carrier 100 according to another exemplary embodiment of the invention. In this embodiment, a component 132, for instance a pressure sensitive body or a semiconductor chip, is embedded in the exposed portion of exposed layer 108 and is exposed itself with regard to an environment. For instance, the component 132 may be a pressure or gas sensor which is exposed to the environment via the upper blind hole 116 and can therefore properly detect pressure or gas in the environment. Alternatively, it is possible that the embedded component 132 is an acceleration sensor moving together with the movable functional diaphragm type layer 108 to thereby precisely detect accelerations in the environment (for instance forming part of an airbag). In yet another embodiment, the embedded component 132 may be an antenna structure capable of transmitting and/or receiving electromagnetic radiation, for instance in a communication device.

Figure 11:
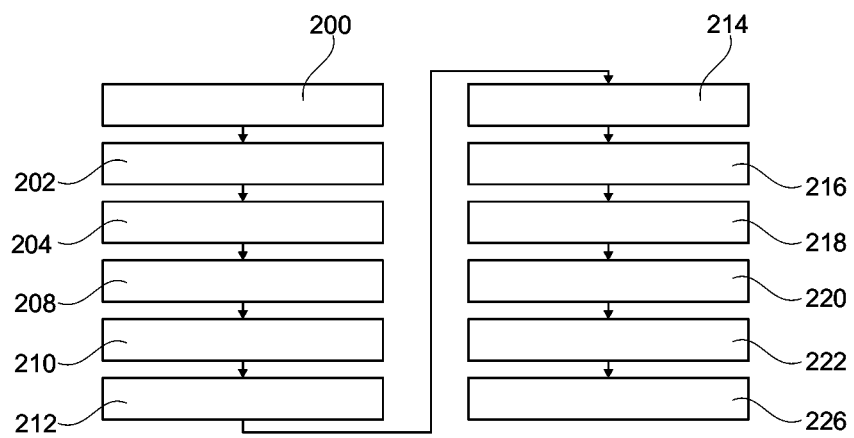
FIG. 11 illustrates a flowchart of a method of manufacturing a component carrier according to an exemplary embodiment of the invention.

FIG. 11 illustrates a flowchart of a method of manufacturing a component carrier 100 according to an exemplary embodiment of the invention. In the following, referring to FIG. 11, a process flow of said method of manufacturing a component carrier 100 will be described.

As indicated by a block 200, an adhesive layer 120, 122 may be applied onto a core having an electrically insulating layer structure 106. For instance, the core may have a thickness of 50 µm. As shown in a block 202, it is then possible to open a clearance (see FIG. 2), for instance by a laser process or a plasma process. As indicated by block 204, a lamination between two constituents as shown in FIG. 2 may then take place, to thereby obtain a structure as shown in FIG. 3. After that, see block 208, laser drilling may be carried out for forming laser vias. Referring to block 210, the laser vias may then be filled with copper material by plating. As indicated by block 212, a structuring process may then be carried out for patterning opposing main surfaces of the structure shown in FIG. 3, to thereby obtain a structure as shown in FIG. 4. Referring to block 214, one or more further electrically conductive layer structures 104 and/or electrically insulating layer structures 106 may then be connected to the stack 102 by lamination, see for instance FIG. 5. As shown in a block 216, opening of a final clearance may then be accomplished, see for instance FIG. 6. Block 218 illustrates a subsequent laser drilling process. As shown in block 220, a subsequent process may be a plating process to fill the laser vias. Block 222 illustrates a further structuring or patterning process, for instance to obtain the structure shown in FIG. 7 or FIG. 8. Finally, block 226 indicates that a solder mask may be applied on surface portions of the manufactured component carrier 100.

Figure 12:
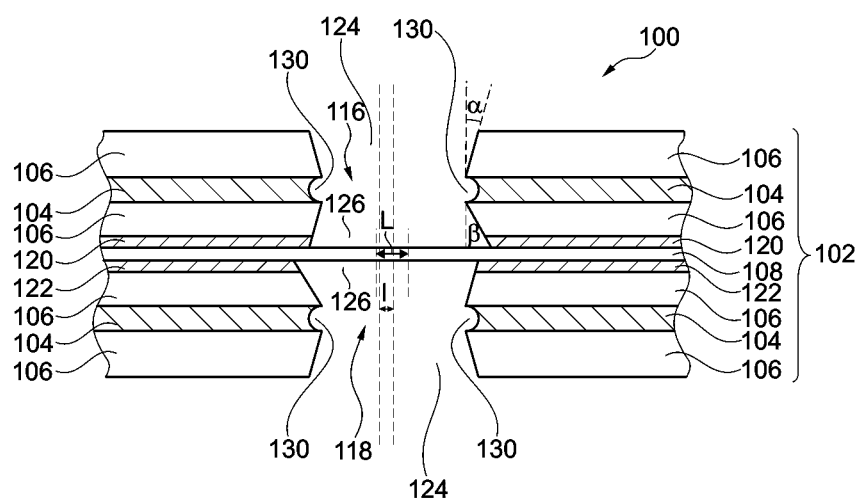
FIG. 12 illustrates a cross-sectional view of a component carrier according to still another exemplary embodiment of the invention.

FIG. 12 illustrates a cross-sectional view of a component carrier 100 according to an exemplary embodiment of the invention.

In the illustration of component carrier 100 according to FIG. 12, certain specific structural features are exaggerated for the purpose of demonstrating the presence of such features. As shown, the result of the formation of the cavities 160 by laser drilling is the presence of a corresponding taper of these cavities 160 in innermost portions 126 as shown in FIG. 12. Again, as a consequence of laser drilling for forming recesses 164 on both opposing main surfaces of stack 102, this also results in a tapering in outermost portions 124, however in opposite direction.

As also shown in FIG. 12, the electrically conductive layer structures 104 which have served as protection layers 165 for both sides of the exposed layer 108 during further build-up have an indentation 130 as a result of their formation by laser processing or etching. Moreover, FIG. 12 indicates that a top to bottom offset is very small, since it is only caused by laser tolerances. The top to bottom offset may be larger in the innermost portions 126 of the blind holes 116, 118 as compared to the outermost portions 124 of the blind holes 116, 118. It should also be mentioned that the tapering in the former cavities 160 may be stronger than in the former recesses 164 ($\alpha < \beta$).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:
1. A component carrier, comprising:
   a stack comprising at least two electrically conductive layer structures and at least one electrically insulating layer structure; and a partially exposed layer in a central region of the stack being exposed with regard to an upper side and a lower side by respective first and second blind holes formed in the stack;

wherein each of opposing main surfaces of the exposed layer is partially covered by a respective adhesive layer;

wherein at least one of the electrically conductive layer structures within the stack has an indentation at an interior sidewall of the stack delimiting the respective blind hole, wherein an innermost portion of the first blind hole tapers from the exposed layer towards a first main surface of the stack into which the first blind hole extends; and/or wherein an innermost portion of the second blind hole tapers from the exposed layer towards a second main surface of the stack into which the second blind hole extends.

2. The component carrier according to claim 1, wherein the component carrier is configured as at least one of a sensor and a microelectromechanical system.

3. The component carrier according to claim 1, comprising at least one of the following features:

wherein the exposed layer forms a functional diaphragm in the blind holes;

wherein the exposed layer comprises or consists of an elastic material;

wherein the exposed layer is a single material layer;

wherein the exposed layer comprises sub-structures of different materials;

wherein a thickness of the exposed layer is in a range between 1 µm and 30 µm;

wherein a lateral offset between a center of an outermost portion of the first blind hole and a center of an outermost portion of the second blind hole is less than 20 µm;

wherein a lateral offset between centers of innermost portions of the respective blind holes is larger than a lateral offset between centers of outermost portions of the respective blind holes.

4. The component carrier according to claim 1, comprising a component embedded in the exposed layer, surface-mounted on the exposed layer, arranged in one of the blind holes next to the exposed layer, or arranged directly behind the exposed layer.

5. The component carrier according to claim 4, comprising at least one of the following features:

wherein at least part of a surface of the component is exposed to an environment;

wherein the component is a sensor component.

6. The component carrier according to claim 1, comprising at least one of the following features:

wherein the stack forms an annular body;

comprising an element to be protected, wherein the exposed layer is arranged for protecting the element to be protected;

wherein the exposed layer comprises or consists of a high-performance plastic material, wherein the high-performance plastic material comprises at least one of the group consisting of polyethylene terephthalate, polyoxymethylene, polyamide, polyimide, polytrimethylene terephthalate, polyetheretherketone, polyetherketonetherketoneketone, polyetherketone, ethylene tetrafluoroethylene, perfluoroalkoxy alkanes, fluorinated ethylene propylene, styrol polymerisate, polycarbonate, polyphenylene sulfide, polyethersulfone, polyphenylsulfone, and polysulfone;

wherein each of the opposing main surfaces of the exposed layer is covered by the respective adhesive layer in portions in which the exposed layer is located within material of the stack, and wherein each of the opposing main surfaces of the exposed layer is free of the respective adhesive layer in portions relating to the blind holes;

comprising at least one component surface mounted on and/or embedded in the stack and/or the exposed layer, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein the at least one electrically conductive layer structure comprises at least one of the group consisting of copper, aluminum, nickel, silver, gold, palladium, and tungsten, any of the mentioned materials being optionally coated with supra-conductive material such as graphene;

wherein the at least one electrically insulating layer structure comprises at least one of the group consisting of reinforced or non-reinforced resin, epoxy resin, bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;

wherein the component carrier is shaped as a plate;

wherein the component carrier is configured as one of the group consisting of a printed circuit board, and a substrate;

wherein the component carrier is configured as a laminate-type component carrier.

7. A method of manufacturing a component carrier, the method comprising:

forming a stack comprising at least two electrically conductive layer structures and at least one electrically insulating layer structure;

forming a first blind hole in the stack extending from a first main surface of the stack up to an exposed layer in a central region of the stack;

forming a second blind hole in the stack, extending from a second main surface of the stack opposing the first main surface, up to the exposed layer; and connecting the exposed layer within the stack between two adhesive layers each arranged on part of a respective one of opposing main surfaces of the exposed layer;

wherein at least one of the electrically conductive layer structures within the stack has an indentation at an interior sidewall of the stack delimiting the respective blind hole, wherein an innermost portion of the first blind hole tapers from the exposed layer towards a first main surface of the stack into which the first blind hole extends; and/or wherein an innermost portion of the second blind hole tapers from the exposed layer towards a second main surface of the stack into which the second blind hole extends.

8. The method according to claim 7, wherein the method comprises arranging a layer to be exposed between two parts of the stack, each part comprising a respective cavity, each cavity exposing a portion of a respective main surface of the layer to be exposed.

9. The method according to claim 8, wherein the method comprises:
connecting, by laminating, one or more further layer structures to exterior main surfaces of the parts of the stack; and
forming a respective recess in the further layer structures on each of the exterior main surfaces to thereby obtain an intermediate structure in which the exposed portion of the layer is protected at both opposing main surfaces of the layer by a remaining protecting layer of the stack.

10. The method according to claim 9, wherein a respective one of the protecting layers is spaced with respect to the layer to be exposed by a respective one of the cavities.

11. The method according to claim 9, wherein the method comprises patterning and plating exterior portions of the intermediate structure.

12. The method according to claim 9, wherein the method comprises subsequently removing exposed portions of the protecting layers so that the blind holes are formed by connecting a respective cavity with a respective recess.

13. The method according to claim 12, wherein the method comprises patterning and plating exterior portions of the further layer structures before removing the exposed portions of the protecting layers.

14. The method according to claim 7, wherein the method comprises forming at least part of the blind holes by laser processing.

15. The method according to claim 8, wherein the method comprises forming the cavities and/or the recesses by laser processing.

16. The component carrier according to claim 1,
wherein an outermost portion of the first blind hole tapers from a first main surface of the stack into which the first blind hole extends towards the exposed layer.

17. The component carrier according to claim 1,
wherein an outermost portion of the second blind hole tapers from a second main surface of the stack into which the second blind hole extends towards the exposed layer.

* * * * *